(12) United States Patent
Venca

(10) Patent No.: US 11,876,444 B2
(45) Date of Patent: Jan. 16, 2024

(54) CONTROL SYSTEM FOR UHF RFID PASSIVE TAGS

(71) Applicant: EM Microelectronic-Marin SA, Marin (CH)

(72) Inventor: Alessandro Venca, Hauterive (CH)

(73) Assignee: EM Microelectronic-Marin SA, Marin (CH)

(*) Notice: Subject to any disclaimer, the term of this patent is extended or adjusted under 35 U.S.C. 154(b) by 0 days.

(21) Appl. No.: 17/774,473

(22) PCT Filed: Dec. 16, 2020

(86) PCT No.: PCT/EP2020/086553
§ 371 (c)(1),
(2) Date: May 4, 2022

(87) PCT Pub. No.: WO2021/089883
PCT Pub. Date: May 14, 2021

(65) Prior Publication Data
US 2022/0393583 A1 Dec. 8, 2022

(30) Foreign Application Priority Data

Jan. 29, 2020 (EP) .................................... 20154405
Nov. 5, 2020 (WO) ................. PCT/EP2020/081172

(51) Int. Cl.
*H02M 3/07* (2006.01)
*G06K 19/07* (2006.01)
(Continued)

(52) U.S. Cl.
CPC .......... *H02M 3/07* (2013.01); *G06K 19/0713* (2013.01); *G11C 5/145* (2013.01); *G11C 29/028* (2013.01); *G11C 29/50008* (2013.01); *H02M 1/0012* (2021.05); *H02M 1/0025* (2021.05); *H02M 3/073* (2013.01)

(58) Field of Classification Search
CPC ....................................................... H02M 3/07
See application file for complete search history.

(56) References Cited

U.S. PATENT DOCUMENTS 5,282,170 A 1/1994 Van Buskirk et al.
7,504,892 B1* 3/2009 Pesucci ................. H03L 7/0896
331/8

(Continued)

OTHER PUBLICATIONS

International Search Report dated Mar. 2, 2021 in PCT/EP2020/086553, filed on Dec. 16, 2020, 2 pages.

*Primary Examiner* — Sibin Chen
(74) *Attorney, Agent, or Firm* — Oblon, McClelland, Maier & Neustadt, L.L.P.

(57) ABSTRACT

A power control unit is provided to control the efficiency of a charge pump converter having a first input terminal and a second input terminal, a primary attenuator and a secondary attenuator between a first input terminal and the second input terminal, a first output terminal, a second output terminal, a secondary attenuator controlling terminal and a primary attenuator controlling terminal to be plugged to the power control unit. The primary attenuator controlling terminal and the secondary attenuator controlling terminal are to attenuate or amplify a signal of the first input terminal and the second input terminal.

13 Claims, 9 Drawing Sheets

(51) Int. Cl.
*H02M 1/00* (2006.01)
*G11C 5/14* (2006.01)
*G11C 29/02* (2006.01)
*G11C 29/50* (2006.01)

(56) References Cited

U.S. PATENT DOCUMENTS

| | | | |
|---|---|---|---|
| 9,588,497 B1* | 3/2017 | Monk | H03L 7/093 |
| 10,394,740 B1* | 8/2019 | Guo | G06F 13/4022 |
| 2008/0100370 A1* | 5/2008 | Chen | H02M 3/073 |
| | | | 327/536 |
| 2019/0334384 A1* | 10/2019 | Yase | H04B 5/02 |
| 2020/0076294 A1* | 3/2020 | Shlomo | H02M 3/33507 |

* cited by examiner

CONTROL SYSTEM FOR UHF RFID PASSIVE TAGS

TECHNICAL FIELD

The present invention relates to the field of power control unit and in particular of a power control unit for UHF RFID passive tags.

STATE OF THE ART

In general, in an RFID communication system, the receiving tag antenna is adapted to maximize the received signal at a specific frequency, i.e. the tuning frequency $f_0$. The adaptation is achieved for a specific antenna and tag input impedance.

In this adapted condition, the received power is maximized, and the Mismatch Loss, ML for short, is minimized.

Every time the input frequency signal carrier fc differs from $f_0$, or the tag or antenna impedances differ from the value needed to achieve adaptation the system suffers a loss in the received power.

In operative conditions, the above disrupting scenario may happen for the following reasons:
 The input signal frequency can operate at different frequencies in the UHF RFID band [860-960] MHz;
 Variations in electronic components values due to process or temperature may cause variation in the tag input impedance; and,
 Environmental conditions in which the tag operates, e.g. medium, humidity, temperature, may alter the antenna adaptation.

Therefore, there is a need to maximize the tag reading distance and this independently of the operative conditions.

U.S. Pat. No. 5,282,170 describes a negative power supply for generating and supplying a regulated negative potential to control gates of selected memory cells during flash erasure. The '170 patent includes several charge pumps means for effectively canceling out threshold voltage drops in the charge pump means. A regulator means responsive to the high negative voltage and a reference potential is provided for generating the regulated negative potential so that it is independent of an external supply potential. However, it is not provided to control an output current from a charge pump converter and to measure an output voltage between signal outputs.

SUMMARY OF THE INVENTION

In order to achieve this objective, the present invention provides a Power control unit configured to control the efficiency of a charge pump converter having a first input terminal and a second input terminal, at least one primary attenuator and at least one secondary attenuator between said first input terminal and said second input terminal, a first output terminal, a second output terminal, at least one secondary attenuator controlling terminal and at least one primary attenuator controlling terminal configured to be plugged to said power control unit; said primary attenuator controlling terminal and said secondary attenuator controlling terminal are configured to attenuate or amplify a signal of said first input terminal and said second input terminal; said power control unit comprising at least:
 a control circuit: said at least control circuit is configured to sense said output power of said charge pump converter through said first output terminal and second output terminal and to transmit a sensed power value as a function of the sensed output power; and,
 a control unit: said at least a control unit is configured to receive said sensed power value, to establish a control value and to send said control value to said secondary attenuator controlling terminal and said primary attenuator controlling terminal such as to attenuate or amplify a signal of said at least one input signal.

Thus, this configuration allows sensing the received power and take actions to minimize the tag sensitivity and thus maximize the tag reading distance.

According to an embodiment, said sensed power value comprises a voltage sensed power value and/or current sensed power value.

According to an embodiment, said voltage sensed power value and/or said current sensed power value is or are analog signal.

Thus, the transmission of said sensed power value as a function of the sensed output power is quicker than digital signal.

According to an embodiment, said control circuit comprises at least one control circuit configured to determine at least a first physical quantity between said first terminal and said second terminal and to measure at least a second physical quantity.

According to an embodiment, said control circuit is configured to control a output current from said device and to measure a output voltage between said first output terminal and said second output terminal at lower input power levels across said first input terminal and said second input terminal, and/or to control said output voltage and measure said output current at higher input power levels.

According to an embodiment, said at least control circuit is configured to conduct a current value by diverting said output current from said first output terminal to said second output terminal such as to evaluate the sensed power value.

According to an embodiment, said at least a control circuit comprises at least:
 a first power input terminal and a second power input terminal: said first power input terminal and said second power input terminal are configured to sense said output current and/or said output voltage value of said device;
 an internal reference: said at least internal reference is configured to set a reference value;
 a comparison circuit: said at least a comparison circuit configured to compare said reference value to said output current value and/or said output voltage value; and
 a current limited buffer: said at least a current limited buffer is configured to divert the current from said first output terminal to said second output terminal such as to evaluate the sensed power value.

According to an embodiment, said at least control unit comprises at least a controller configured to establish an established voltage value and/or an established current value as a function of said sensed current value and/or said sensed voltage value of said device.

According to an embodiment, said at least bias supplier comprises at least a converter configured to convert said sensed current value and/or said sensed voltage value of said device into a digital voltage value and/or a digital current value.

The present invention relates to a Control system device comprising at least one charge pump converter and a power control unit according to any of the preceding claims; said charge pump converter having a first input terminal and a second input terminal, at least one primary attenuator and at least one secondary attenuator between said first input terminal and said second input terminal, a first output terminal, a second output terminal, at least one secondary attenuator controlling terminal and at least one primary attenuator controlling terminal configured to be plugged to said power control unit.

Thus, this configuration allows sensing the received power and take actions to minimize the tag sensitivity and thus maximize the tag reading distance.

According to an embodiment, said at least one charge pump converter comprises at least one primary gate controller and at least one secondary gate controller; said at least one primary gate controller comprises at least one primary attenuator, at least one;
  primary signal output: said at least one primary signal output is configured to be connected to an at least one second primary signal input of a charge pump converter and/or a first circuit;
  first primary signal input: said at least one first primary signal input is configured to receive a first control signal;
  primary bias input: said at least one primary bias input configured to establish a voltage value and/or a current value of said at least one primary gate controller;
  second primary signal input: said at least one second primary signal input configured to be connected to an at least one primary signal output of a charge pump converter and/or to receive said main signal, preferably from an antenna, from an integrated circuit, at least one primary signal and/or from a charge pump converter; and,
  said at least one secondary gate controller comprises at least one secondary attenuator, at least one:
  secondary signal output: said at least one secondary signal output is configured to be connected to an at least one second secondary signal input of a charge pump converter and/or a second circuit;
  first secondary signal input: said at least one first secondary signal input is configured to receive a second control signal;
  secondary bias input: at least one bias input configured to establish a voltage value and/or a current value of said at least one secondary gate controller; and,
  second secondary signal input: said at least one second secondary signal input configured to be connected to an at least one secondary signal output of a charge pump converter and/or to receive a main signal, preferably from an antenna, from an integrated circuit, at least one secondary signal and/or from a charge pump converter;
  said at least one first primary signal input is configured to be connected to said at least one secondary signal output and said at least one first secondary signal input is configured to be connected to said at least one primary signal output.

Thus, this configuration allows sensing the received power and take actions to minimize the tag sensitivity and thus maximize the tag reading distance by adjusting the bias voltage of the gate.

More specifically, the present invention comprises a gate controller having a primary signal input, a gate, one or more bias input each connected to the gate through a resistor or a transistor such as to control the DC voltage bias of the gate and therefore the conductivity of the switching element.

According to an embodiment, said at least one primary attenuator comprises at least one first primary capacitor connected between said at least one primary attenuator input and said at least one primary attenuator output, and at least one second primary capacitor connected between said at least one primary attenuator output and said ground, and/or said at least one secondary attenuator comprises at least one first secondary capacitor connected between said at least one secondary attenuator input and said at least one secondary attenuator output, and at least one second secondary capacitor connected between said at least one secondary attenuator output and said ground.

According to an embodiment, said at least one primary attenuator controlling terminal is configured to control the capacitance of said at least one second primary capacitor and/or the capacitance of said at least one second secondary capacitor.

According to an embodiment, said at least one secondary attenuator controlling terminal is configured to control the capacitance of said at least one first primary capacitor and/or the capacitance of said at least one first secondary capacitor.

Thanks to one of those the arrangements according to the invention, the control on the K factor is made by trimming the values of said at least one first primary capacitor, said at least one second primary capacitor, said at least one first secondary capacitor and/or said at least one second secondary capacitor in said charge pump converter. Indeed, since it exists an optimal k-factor for each process and temperature, the charge pump converter stage efficiency can be in this way maximized over process and temperature.

According to an embodiment, said at least one primary gate controller comprises at least one primary switching element having a primary conduction path with a first primary terminal and a second primary terminal, and a primary gate configured to control the current flowing through said primary conduction path, said primary conduction path being configured to provide said at least one primary signal; said primary gate is configured to be connected to said at least one first primary signal input and to said at least one primary bias input, and/or said at least one secondary gate controller comprises at least one secondary switching element having a secondary conduction path with a first secondary terminal and a second secondary terminal, and a secondary gate configured to control the current flowing through said secondary conduction path, said secondary conduction path being configured to provide said at least one secondary signal; said secondary gate is configured to be connected to said at least one first secondary signal input and to said at least one secondary bias input.

Thanks to the arrangement according to the invention, the charge pump converter allows adjusting the bias voltage of the gate by coupling the gate of the switching element to the output of the previous charge pump converter stage and said at least one bias input, which sets the DC gate's voltage reference bias.

BRIEF DESCRIPTION OF THE DRAWINGS

The foregoing and other purposes, features, aspects and advantages of the invention will become apparent from the following detailed description of the embodiments, given by way of illustration and not limitation with reference to the accompanying drawings, in which.

DESCRIPTION OF THE INVENTION

The present invention relates to a power control unit 100 configured to monitor the output power of a charge pump converter 500 such as to maximize the received signal at a specific frequency, i.e. the tuning frequency $f_0$.

Indeed, said power control unit 100 may be connected to a charge pump converter 500.

Figure 1:
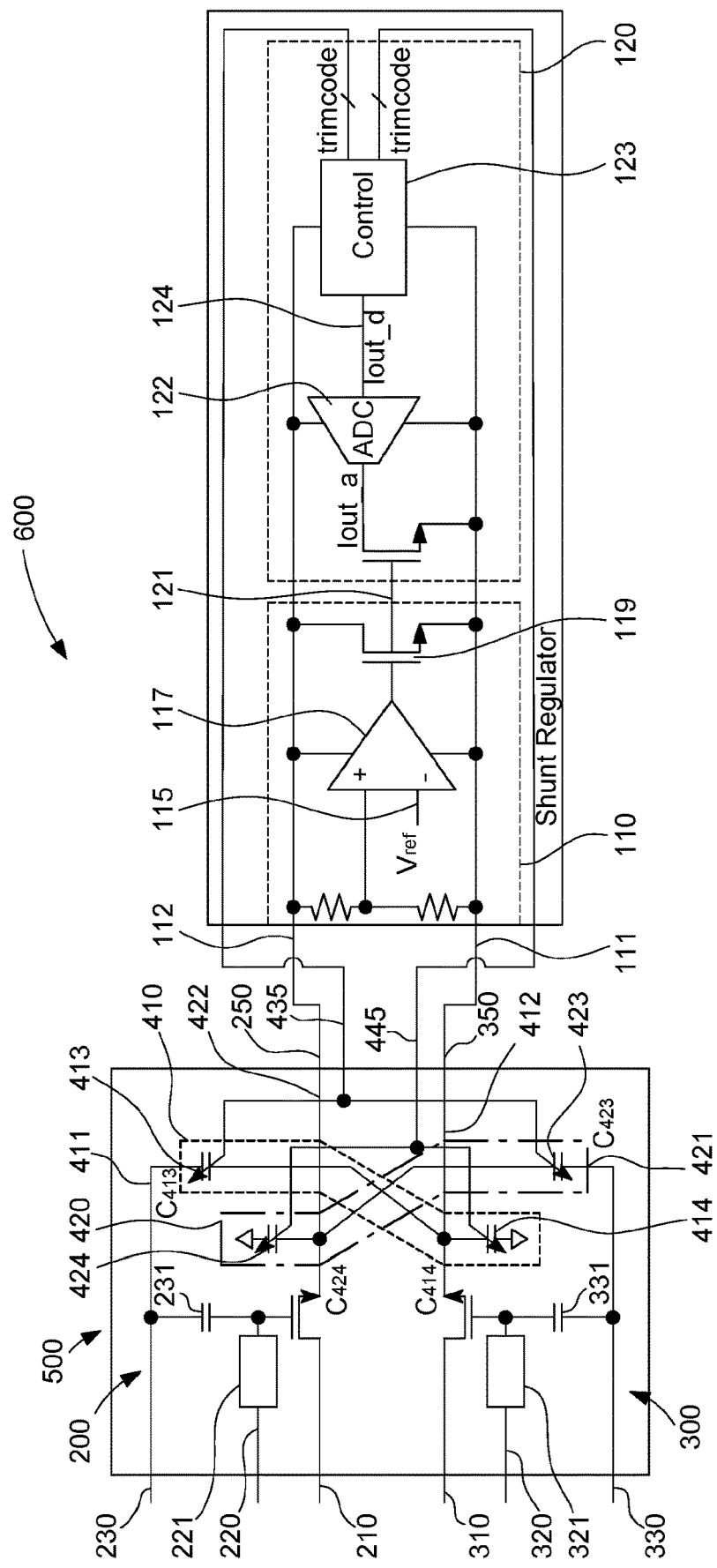
FIGS. 1A and 1B represent a power control unit 100 connected to a charge pump converter 500 such as to form a control system device 600 according to the invention.

Said charge pump converter 500 may have an input impedance between a first input terminal 210 and a second input terminal 310, and a first output terminal 250, a second output terminal 350, a primary attenuator controlling terminal 435 and a secondary attenuator controlling terminal 445, as illustrated in FIG. 1.

Said primary attenuator controlling terminal 435 and said secondary attenuator controlling terminal 445 may be configured to be plugged to said power control unit 100 and to modify a K-factor, also known as Q-factor.

Effectively, to maximize the received power, $P_{in}$ 510 for short, is a necessary but not yet enough condition to maximize the load power, i.e. the rectifier output power, $P_{out}$ 520 for short, and in order to maximize the load power it is necessary to maximize also the rectifier efficiency, eff 105 for short, and the K-factor.

The relation between the power available at the antenna, $P_{avail}$ 930 for short, and the load power, $P_{out}$ for short, being:

$$P_{out} = P_{avail} * \frac{\text{eff}}{ML}$$

where $\text{eff} = \frac{P_{out}}{P_{in}}$ and $ML = \frac{P_{avail}}{P_{in}}$

The mismatch loss, ML 505 for short, can be expressed in terms of the series impedances of antenna and tag as:

$$\frac{1}{ML} = \frac{4R_a R_{ts}}{(R_a + R_{ts})^2 + (X_a + X_{ts})^2}$$

Where the antenna series impedance is $Z_a=R_a+jX_a$ and the tag series impedance is $Z_{ts}=R_{ts}+jX_{ts}$.

The ML is minimized, i.e. ML=1, at conjugate matching. In others words, when $R_a=R_{ts}$ and $X_a=X_{ts}$.

The following «match» parameter is used hereafter to quantify the load power for a given available power:

$$\frac{\text{eff}}{ML} = \text{eff} * \frac{4R_a R_{ts}}{(R_a + R_{ts})^2 + (X_a + X_{ts})^2} = \frac{P_{out}}{P_{avail}} \text{ with } 0 \leq \frac{\text{eff}}{ML} \leq 1$$

In a RFID tag front-end the input equivalent circuit is a parallel of a resistance, $R_{tp}$ 504 for short, and a capacitance, $C_{tp}$ 503 for short.

The input parallel resistance is defined by the rectifier input parallel resistance.

At the frequency $f_0$ the parallel equivalent circuit can be represented by the equivalent series circuit, $R_{ts}$ 507 and $C_{ts}$ 506, according to the transformation formulas:

$$R_{ts} = \frac{R_{tp}}{1+Q^2}$$

$$C_{ts} = C_{tp} \frac{1+Q^2}{Q^2}$$

$$Q = 2\pi f_0 C_{tp} R_{tp}$$

Said power control unit 100, according to the present invention, may sense the rectifier output power $P_{out}$ and controls the match parameter thus in turn controlling the rectifier input resistance $R_{tp}$ and efficiency eff. The match parameter may be a function of ML, i.e. function of $R_{ts}$ and $R_{tp}$, and eff.

The control on the rectifier input resistance and efficiency is based on charge pump converter topology, as described in EP15207239, in particular, the applicant hereby incorporate p.5, 1.24-p7,1.30, p.8, 1.3-p.9, 1.17, p.9, 1.20-p.10, 1.2 and p.11, 1.1-24 by reference to EP15207239.

More precisely, the control on the rectifier input resistance and efficiency may act on said primary attenuator controlling terminal 435 and said secondary attenuator controlling terminal 445 of a charge pump converter 500.

The present invention relates to a charge pump converter 500 comprising at least one primary gate controller 200 and at least one secondary gate controller 300 as depicted in FIGS. 1A and 1B. Said at least one primary gate controller 200 may comprise at least one primary signal output 250, at least one first primary signal input 230, at least one primary bias input 220 and at least one second primary signal input 210.

Said at least one primary signal output 250 may be connected in series to a first circuit and/or an at least one second primary signal input 210 of a charge pump converter 500. Indeed, said at least one second primary signal input 210 may be connected to, preferably directly connected to an at least one primary signal output 250 of a following charge pump converter 500 and/or to receive a main signal, preferably from an antenna, from an integrated circuit and/or from a charge pump converter 500, and said at least one first primary signal input 230 may receive a first control signal and said at least one primary bias input 220 may establish a voltage value and/or a current value of said at least one primary gate controller 200.

Further, said at least one primary gate controller 200 may comprise at least one primary switching element 240 having a primary conduction path 245 with a first primary terminal 241 and a second primary terminal 242, and a primary gate 243 configured to control the current flowing through said primary conduction path 245: said primary conduction path 245 may provide said at least one primary signal. By controlling, the skilled man in the art would understand that the current flowing through said primary conduction path 245 or said secondary conduction path 345 may be varied in amplitude, frequency, and/or in phase such as to be transmitted to another charge pump converter stage for instance as shown in FIGS. 1A and 1B.

Said primary gate 243 may be also connected to, preferably directly connected to said at least one first primary signal input 230 preferably via at least one primary coupling capacitor 231 and to said at least one primary bias input 220 via at least one primary bias element 221, like at least one first primary bias current flow controller 221. So, the charge pump converter stage allows adjusting the bias voltage of said primary gate 243 by coupling said primary gate 243 of the switching element to the output of the previous charge pump converter stage and/or said at least one bias input, which sets the DC gate's voltage reference bias.

Similarly to said at least one primary gate controller 200, said at least one secondary gate controller 300 may comprise at least one secondary signal output 350, at least one first secondary signal input 330, at least one secondary bias input 320 and at least one second secondary signal input 310. Said secondary gate 343 may be also connected to, preferably directly connected to said at least one first secondary signal input 330 preferably via at least one secondary coupling capacitor 331 and to said at least one secondary bias input 320 via at least one secondary bias element 321, like at least one first secondary bias current flow controller 321.

Said at least one secondary signal output 350 may be connected in series to a second circuit an at least one second secondary signal input 310 of a charge pump converter 500. Indeed, said at least one second secondary signal input 310 may be connected to, preferably directly connected to an at least one secondary signal output 350 of a following charge pump converter 500 and/or to receive said main signal, preferably from an antenna, from an integrated circuit and/or from a charge pump converter 500, and said at least one first secondary signal input 330 may receive a second control signal, and said at least one secondary bias input 320 may establish a voltage value and/or a current value of said at least one secondary gate controller 300. As shown in FIGS. 1A and 1B, said at least one first primary signal input 230 may be connected to, preferably directly connected to said at least one secondary signal output 350 and said at least one first secondary signal input 330 may be connected to, preferably directly connected to said at least one primary signal output 250.

Further, said at least one secondary gate controller 300 may comprise at least one secondary switching element 340 having a secondary conduction path 345 with a first secondary terminal 341 and a second secondary terminal 342, and a secondary gate 343 configured to control the current flowing through said secondary conduction path 345: said secondary conduction path 345 may provide said at least one secondary signal.

Said secondary gate 343 may be also configured to be connected to, preferably directly connected to said at least one first secondary signal input 330, via at least one secondary coupling capacitor 331, and to said at least one secondary bias input 320. So, the charge pump converter stage allows adjusting the bias voltage of said secondary gate 343 by coupling the said secondary gate 343 of the switching element to the output of the previous charge pump converter stage and said at least one bias input, which sets the DC gate's voltage reference bias.

In order to adjust the bias voltage of the gates 243, 343, the gates 243, 343 of the switching elements in said at least one primary gate controller 200 and said at least one secondary gate controller 300 may be coupled to the output of the previous charge pump converter stage and/or said at least one bias input 220, 320, which sets the DC gate's voltage reference bias. More specifically, the present invention may comprise said at least one primary gate controller 200 and said at least one secondary gate controller 300 having said primary gate 243, said at least one primary bias input 220 connected to, preferably directly connected to said primary gate 243 through a bias element like a resistor or a transistor and said secondary gate 343, said at least one secondary bias input 320 connected to, preferably directly connected to said secondary gate 343 through at least one primary bias element 221 and/or at least one secondary bias element 321 like a resistor or a transistor respectively such as to control the DC voltage bias of said primary gate 243 and said secondary gate 343 and therefore the conductivity of at least one primary switching element 240 and at least one secondary switching element 340 respectively. Said bias inputs, more precisely said at least one primary bias input 220 and said at least one secondary bias input 320 may be properly connected to, preferably directly connected to internal nodes of said charge pump converter 500 such that said at least one primary gate controller 200 and said at least one secondary gate controller 300 are self-biased without using bias-reference external to the charge pump. As it may be in FIGS. 1A and 1B, where said at least one primary bias input 220 may be directly connected to, preferably directly connected to said at least one second primary signal input 210, and said at least one secondary bias input 320 may be directly connected to, preferably directly connected to said at least one second secondary signal input 310.

As previously mentioned, said bias element may be a resistor or a transistor. Indeed, said at least one primary bias input 220 may comprise at least one first primary bias current flow controller 221, like at least one first primary bias transistor 221. In some embodiments not represented, said primary gate 243 may be connected to, preferably directly connected to said second primary terminal 242, rather said at least one primary signal output 250 via an at least one second primary bias current flow controller and/or at least one second primary bias transistor thus the primary conduction path 245 of the primary switching element 240 may be controlled. The same applies for the secondary switching element 340 with at least one first secondary bias current flow controller 221, like at least one first secondary bias transistor 221 and at least one second secondary bias current flow controller like at least one second secondary bias transistor.

The applicant does not exclude the gate voltage of said primary gate 243 may be determined by configuration of said at least one first primary bias current flow controller 221, like a resistor, and at least one second primary bias current flow controller, like a resistor, forming a resistive divider and the DC primary gate voltage may be comprised between the voltage value of said at least one second primary signal input 210 and of a second primary terminal 242. The same applies for the secondary switching element 340.

According to some embodiments not represented, instead of a resistor as said at least one first primary bias current flow controller 221 and/or as said at least one second primary bias current flow controller, a transistor and preferably by a MOS transistor may be used such as the primary conduction path 245 of the primary switching element 240 may be controlled and may make said charge pump converter 500 programmable and more specifically said at least one primary gate controller 200 programmable. The same applies for the secondary switching element 340.

Further, said at least one first primary bias transistor 221 may be trimmed such as to control the current flowing through and/or said at least one first primary bias transistor 221 and/or wherein said at least one second primary bias transistor may be trimmed such as to control the current flowing through said at least one first primary bias transistor 221. So, the primary conduction path 245 of the switching element 240 may be controlled which makes the charge pump converter programmable via an integrated circuit, a microcontroller and/or a processor. The same applies for the secondary switching element 340.

The applicant may want to have a linear control of said charge pump converter 500 programmable and more specifically said at least one primary gate controller 200 programmable a potentiometer and/or the digital potentiometer may replace said transistor and preferably said MOS transistor in linear with a controlled channel resistance. Since the plurality of primary bias current flow controller may comprise at least one first primary bias transistor 221 and at least one second primary bias transistor, the conduction path 245 of the primary switching element 240 may be linearly controlled and may make the charge pump converter programmable via an integrated circuit, a microcontroller and/or a processor. The same applies for the secondary switching element 340.

Moreover, since it exists an optimal k-factor for each process and temperature, in prior art, the charge pump efficiency 999 may vary uncontrollably as a function of temperature, for example. Whereas, the charge pump converter stage efficiency 199 according the invention, can be maximized for a given process and temperature. In order to achieve this, said charge pump converter 500 may comprise at least one primary attenuator 410 and/or at least one secondary attenuator 420.

Figure 7:
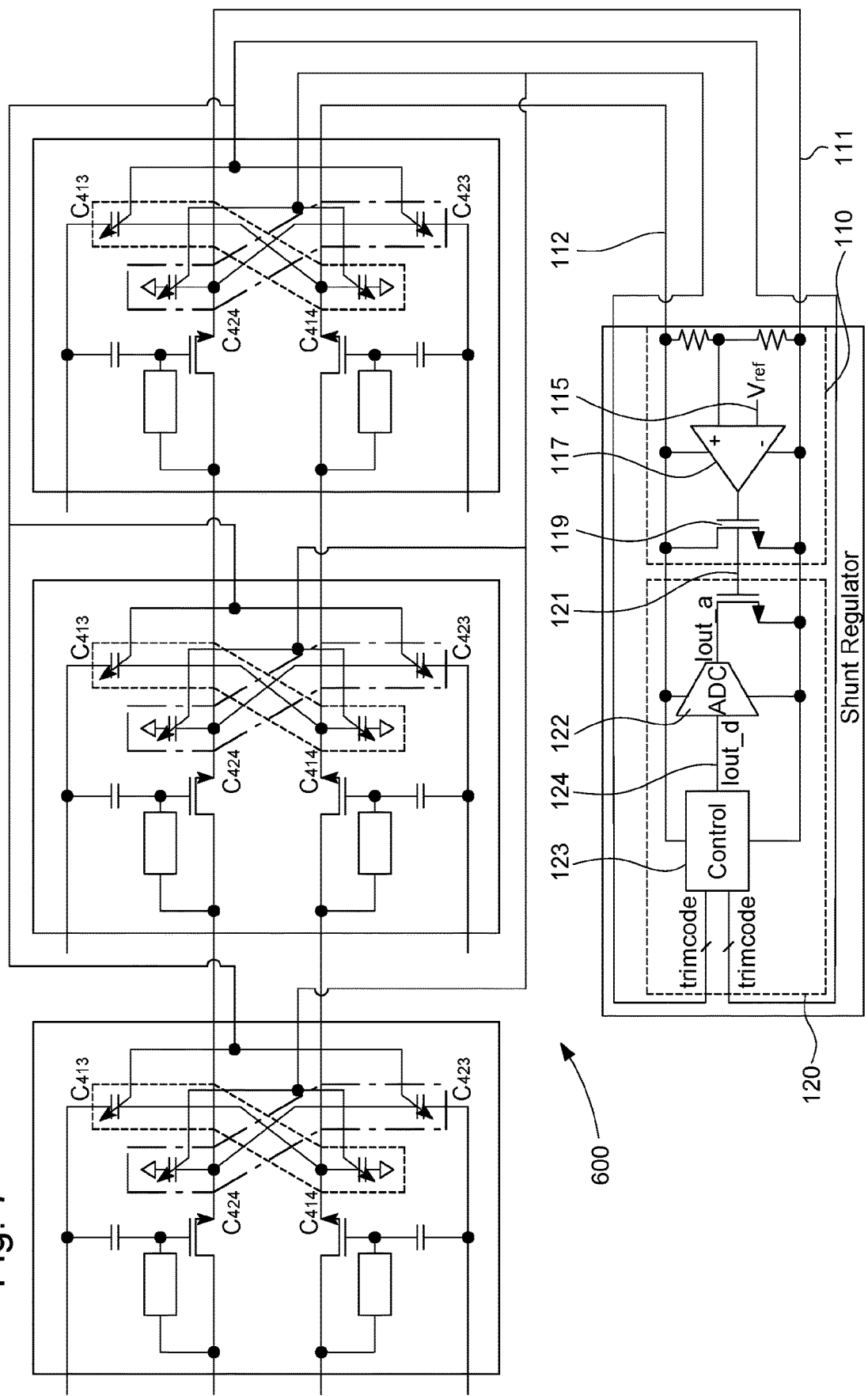
FIG. 7 presents a control system device 600 according to an embodiment of the invention.

As illustrated in FIGS. 1A, 1B, and 7, said at least one primary attenuator 410 may comprise a ground 499, at least one primary attenuator input 411 configured to be connected to, preferably directly connected to said at least one first primary signal input 230 and at least one primary attenuator output 412 configured to be connected to, preferably directly connected to said at least one secondary signal output 350, such as said at least one primary signal may be attenuated or amplified through said at least one primary attenuator 410.

Similarly, said charge pump converter 500 may comprise said ground 499, at least one secondary attenuator input 421 configured to be connected to, preferably directly connected to said at least one first secondary signal input 330 and at least one secondary attenuator output 422 configured to be connected to, preferably directly connected to said at least one primary signal output 250, such as said at least one secondary signal may be attenuated or amplified through said at least one secondary attenuator 420.

Said at least one primary attenuator 410 may comprise at least one first primary capacitor 413 connected between said at least one primary attenuator input 411 and said at least one primary attenuator output 412, and at least one second primary capacitor 414 connected between said at least one primary attenuator output 412 and said ground 499. In other side, said at least one secondary attenuator 420 may comprise at least one first secondary capacitor 423 connected between said at least one secondary attenuator input 421 and said at least one secondary attenuator output 422, and at least one second secondary capacitor 424 connected between said at least one secondary attenuator output 422 and said ground 499.

In order to control the K factor and thus the attenuation and amplification of said at least one primary signal and/or said at least one secondary signal, the value or values of said at least one first primary capacitor 413, said at least one second primary capacitor 414, said at least one first secondary capacitor 423 and/or said at least one second secondary capacitor 424 may be trimmed via at least one secondary attenuator controlling terminal 445 and/or at least one primary attenuator controlling terminal 435. Indeed, since it exists an optimal k-factor for each process and temperature, said at least one primary attenuator 410 and/or at least one secondary attenuator 420 may be trimmed such as to attenuate or amplify said at least one primary signal and/or said at least one secondary signal and thus the charge pump converter stage efficiency may be maximized over process and temperature.

In order to attenuate or amplify said at least one primary signal and/or said at least one secondary signal, said charge pump converter 500 may comprise at least one secondary attenuator controlling terminal 445 configured to trim said at least one primary attenuator 410 and/or said at least one secondary attenuator 420. It may be also possible that said charge pump converter 500 may comprise also at least one primary attenuator controlling terminal 435 configured to trim said at least one primary attenuator 410 and/or said at least one secondary attenuator 420 in order to achieve the attenuation or the amplification of said at least one primary signal and/or said at least one secondary signal.

So, the control on the K factor may be made by trimming the values of said at least one first primary capacitor 413, said at least one second primary capacitor 414, said at least one first secondary capacitor 423 and/or said at least one second secondary capacitor 424 in said charge pump converter 500. Indeed, since it exists an optimal k-factor for each process and temperature, the charge pump converter stage efficiency can be in this way maximized over process and temperature.

As it may be observed in FIGS. 1A, 1B, and 7, said at least one secondary attenuator controlling terminal 445 may control the capacitance $C_{414}$ of said at least one second primary capacitor 414 and/or the capacitance $C_{424}$ of said at least one second secondary capacitor 424. Similarly, said at least one primary attenuator controlling terminal 435 may control the capacitance $C_{413}$ of said at least one first primary capacitor 413 and/or the capacitance $C_{423}$ of said at least one first secondary capacitor 423.

As example, the following formula describes a sinusoidal clock signal RFin(X) from said at least one first secondary signal input 330:

$$RFin(X) = RFin_{0-pk} \cdot \sin(2\pi f t)$$

X being the number of said gate controller 100, for example the third charge pump converter 500 would be written as follow: RFin(3).

Neglecting the stray capacitance, the input voltage of the third at least one primary gate controller 200 and at least one secondary gate controller 300, rather the voltage of said at least one second primary signal input 210, for example, could be written as:

$$OUT(3-1) = K \cdot (3-1) \cdot (2 \cdot RFin_{0-pk} - V_{diode}) + K \cdot RFin_{0-pk} \sin(2\pi f t)$$

and the gate voltage on said primary gate 243 of the 3$^{rd}$ gate controller 100 is:

$$G(3) = vbias3 + RFin_{0-pk} \sin(2\pi f t)$$

Where K being an attenuation coefficient or an amplification coefficient of said at least one primary attenuator 410, as previously mentioned:

$$K = \frac{C_{243}}{C_{243} + C_{424}}$$

Figure 2:
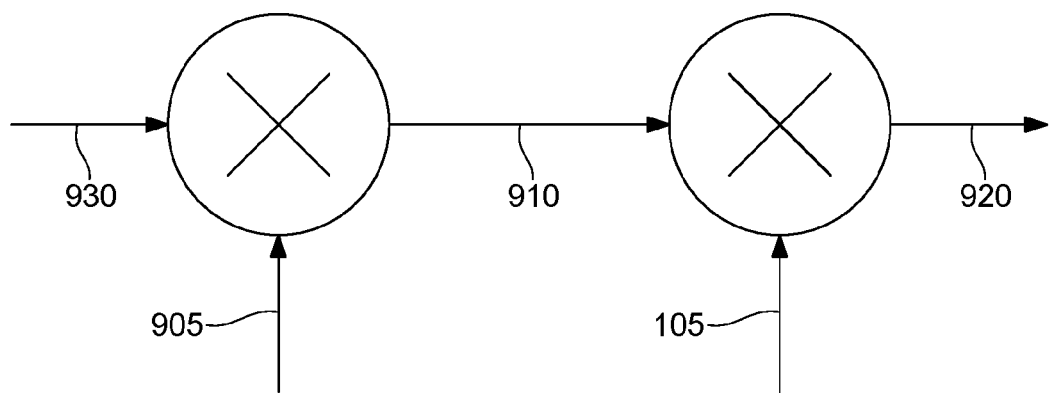
FIG. 2 shows a block diagram.
Figure 3:
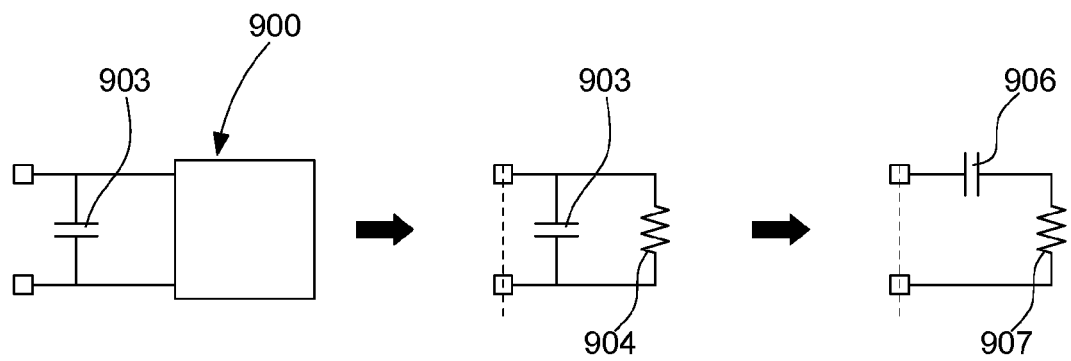
FIG. 3 illustrates a parallel equivalent circuit and a series equivalent circuit of a charge pump converter 500.
Figure 4A:
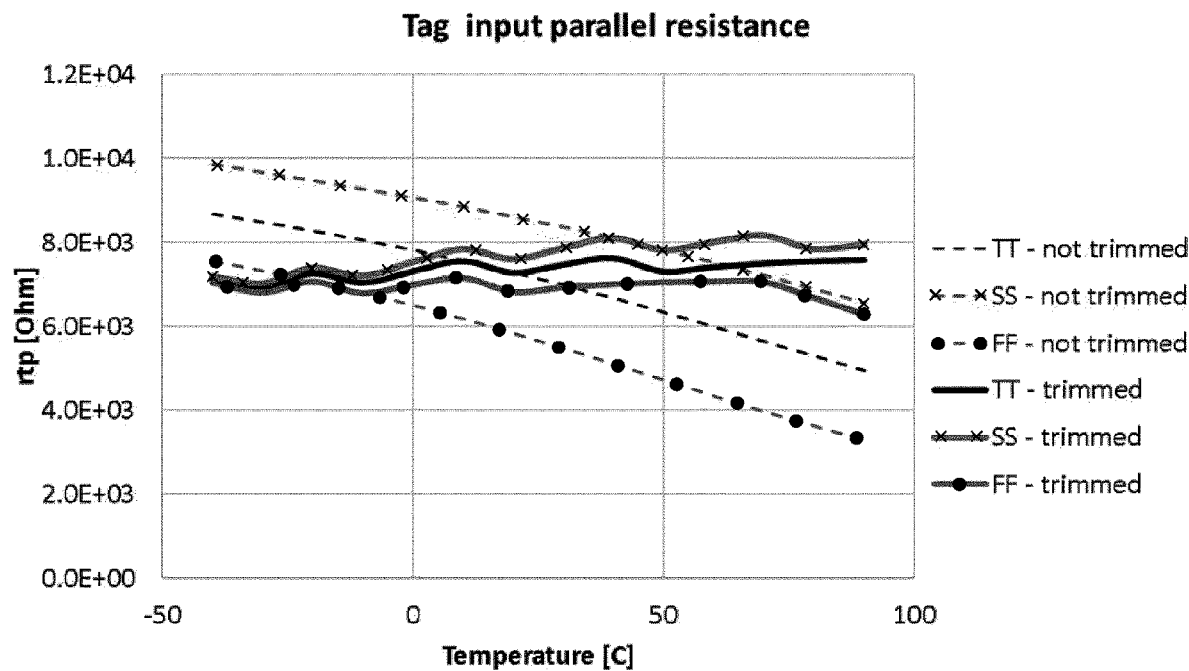
FIGS. 4A-4G represent a AutoMatch tag performances at $f_{in}=f_0$.
Figure 4B:
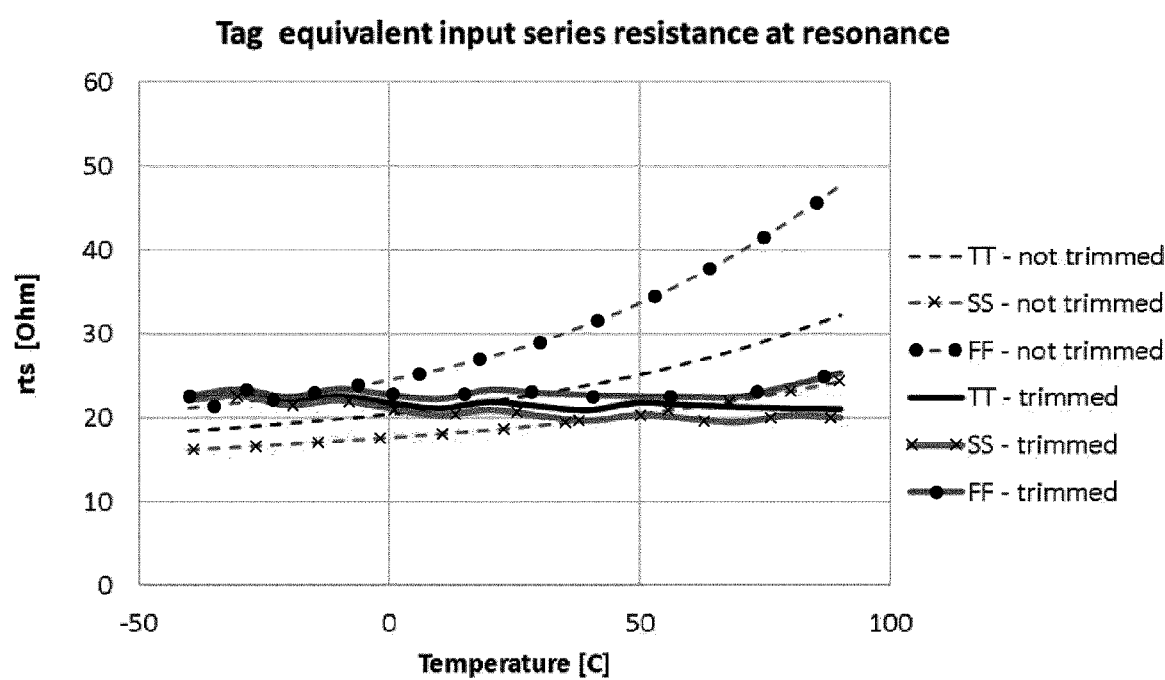
Figure 4C:
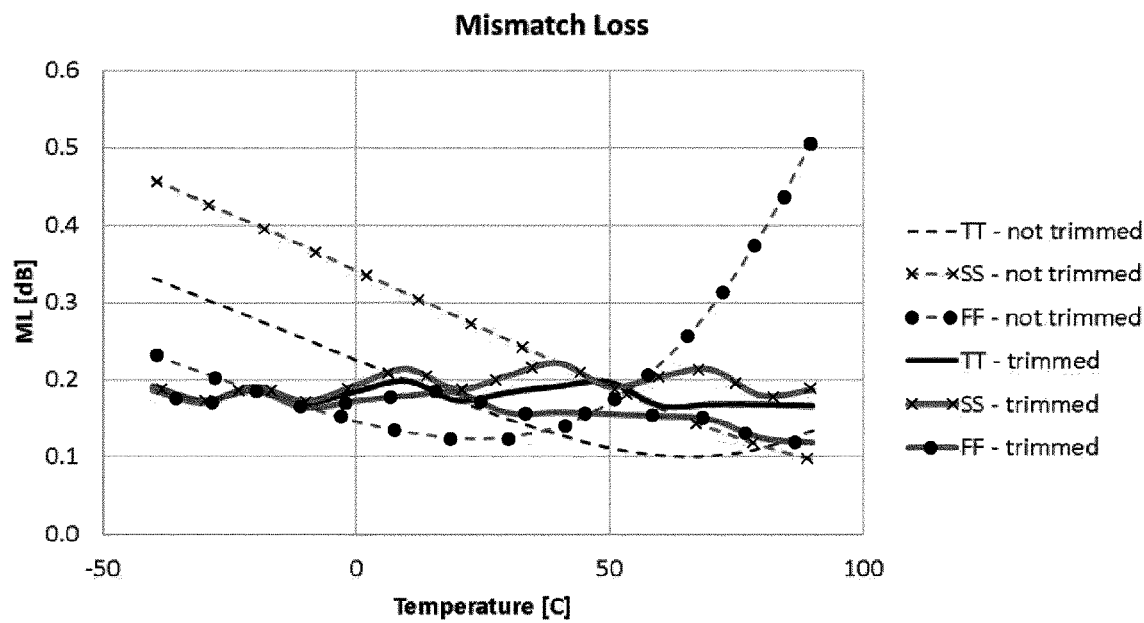
Figure 4D:
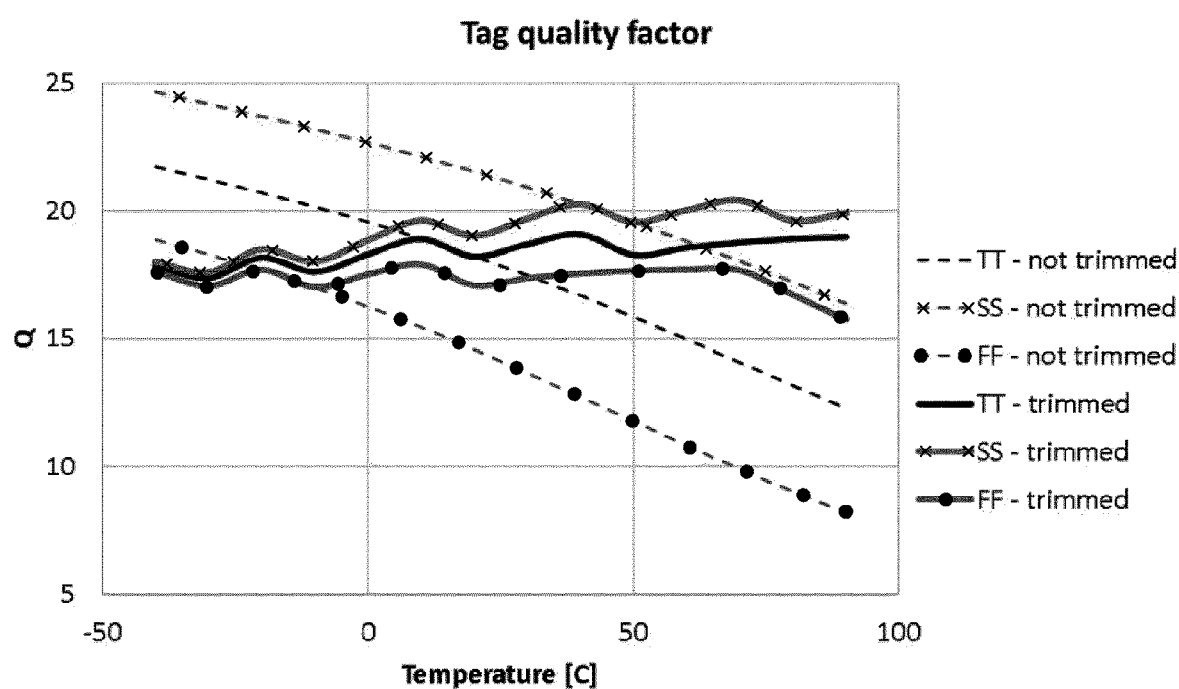
Figure 4E:
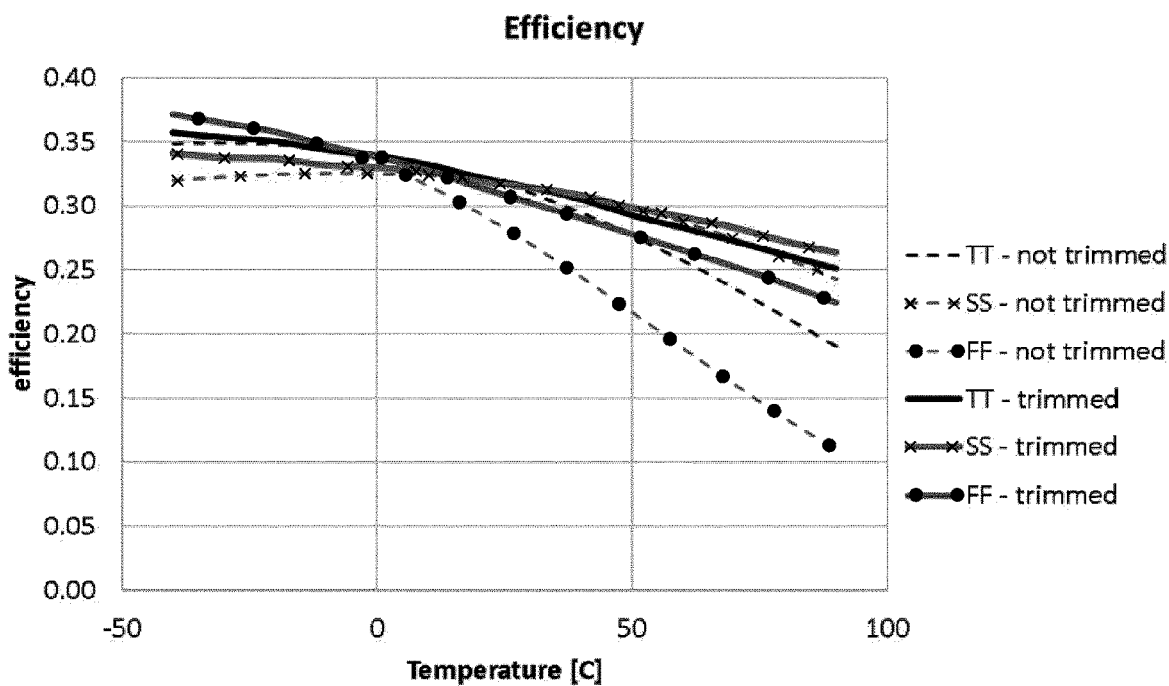
Figure 4F:
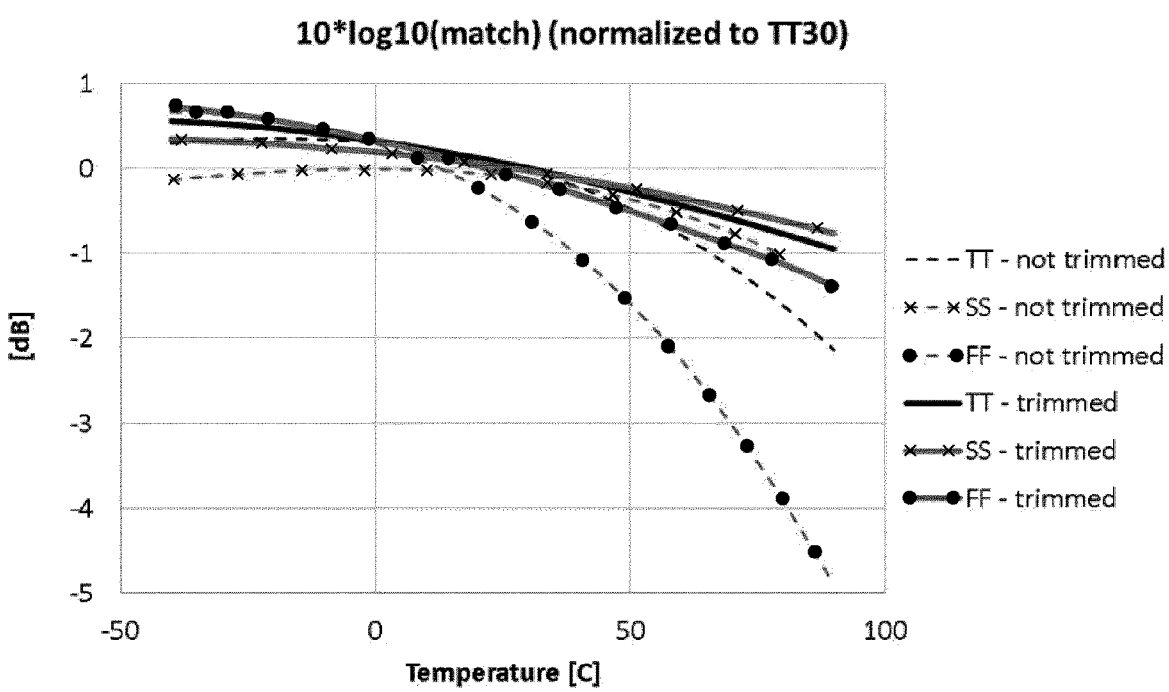
Figure 4G:
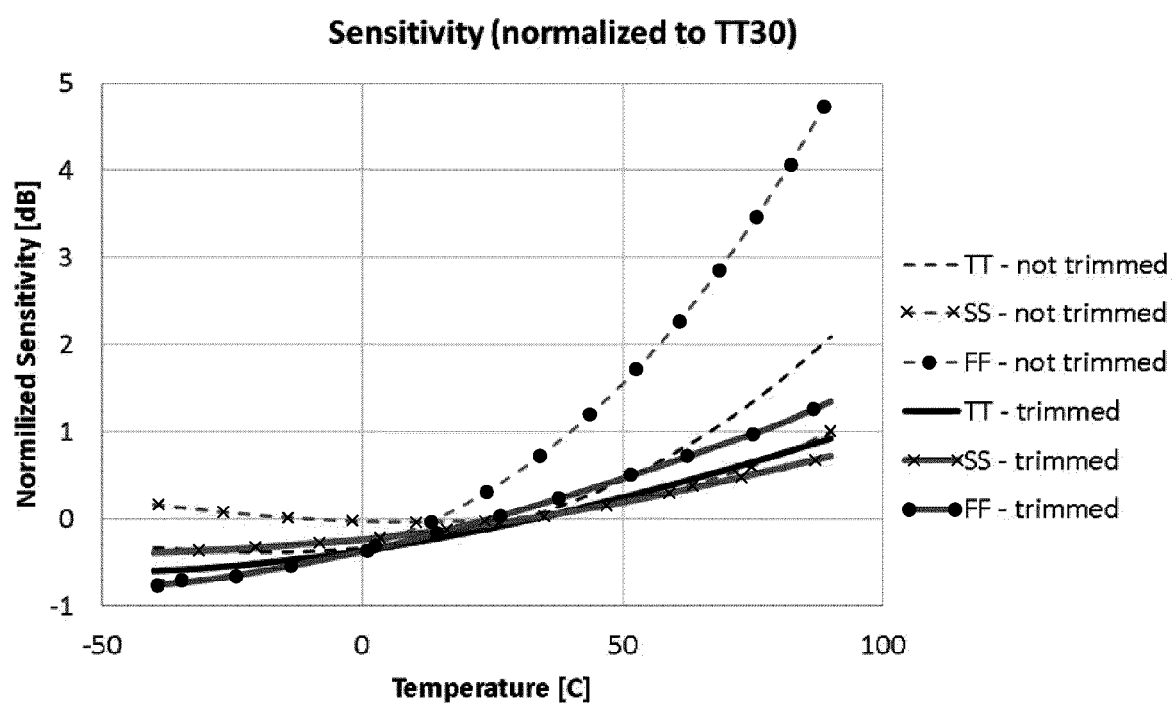
Figure 6:
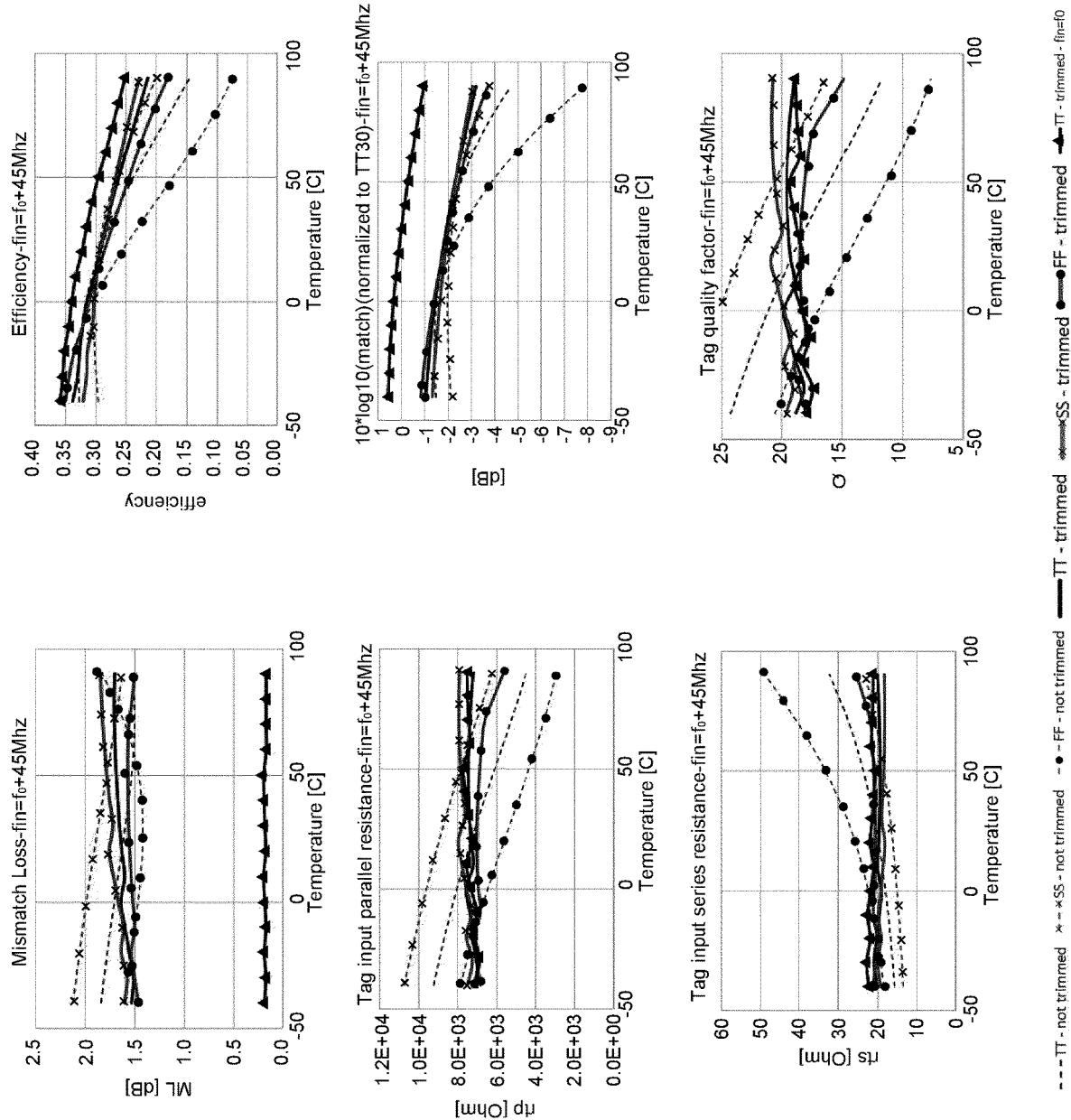
FIG. 6 illustrates a AutoMatch tag performances at $f_{in}=f_0+45$ MHz.

Further, as early mentioned, said at least one primary bias input 220 can be properly connected to a bias-reference external to the charge pump or alternatively to an internal node of the charge pump, or charge pump stages, as shown on FIGS. 2, 4 and 6, such that said at least one primary gate controller 200 is self-biased without using bias-reference external to the charge pump.

As shown in FIG. 7, a charge pump converter, according to another aspect of the invention, may comprise a plurality of charge pump converter 500 according to any precedent embodiment.

Said at least one primary gate controller 200 and said at least one secondary gate controller 300 are in differential and said at least one first primary signal input 230 of all charge pump converter 500 are connected to each other and said at least one first secondary signal input 330 of all charge pump converter 500 are also connected to each other, and said at least one second primary signal input 210 is connected to said at least one primary signal output 250 of a previous charge pump converter 500. The same applies for said at least one secondary gate controller 300, e.g. said at least one secondary signal output 350 is connected to an at least one second secondary signal input 310 of a previous charge pump converter 500.

In the following description, the applicant may describe how said power control unit 100 may work with at least one charge pump converter 500 such as to form at least one control system device 600.

For a given input power, by maximizing the output power in a charge pump converter relatively constant over process and temperature variations for example, input resistance $R_{tp}$ and rectifier efficiency eff are obtained.

It follows that said power control unit 100, by reducing the spread of the match parameter makes the Sensitivity and the reading distance tag performance more constant and reliable across temperature and process variations.

It also follows that said power control unit 100, by reducing the spread of the rectifier input resistance $R_{tp}$ makes the tag quality factor K more constant over temperature and process variations enabling more consistent Sensitivity and tag reading distance performances across the UHF band. Indeed, by controlling the K factor, said at least one primary signal and/or said at least one secondary signal may be attenuated and/or amplified, and the value or values of said at least one first primary capacitor 413, said at least one second primary capacitor 414, said at least one first secondary capacitor 423 and/or said at least one second secondary capacitor 424 may be trimmed via at least one secondary attenuator controlling terminal 445 and/or at least one primary attenuator controlling terminal 435. In others words, since it exists an optimal k-factor for each process and temperature, said at least one primary attenuator 410 and/or said at least one secondary attenuator 420 may be trimmed such as to attenuate or amplify said at least one primary signal and/or said at least one secondary signal and thus the charge pump converter stage efficiency may be maximized over process and temperature.

At the resonance, i.e. when $X_a = -X_{ts}$, it may be possible that the equivalent series resistance at resonance $R_{ts}$ matches the antenna resistance $R_a$ minimizing the mismatch loss ML.

If the $P_{avail}$ is the minimum input power at which the Tag can operate, then said power control unit 100 may minimize the tag Sensitivity and may maximize the tag reading distance over temperature and process variations.

Thus, using at least one charge pump converter 500 and said power control unit 100, it is possible to perform an automatic control of the input resistance and efficiency of the match parameter of said at least one charge pump converter 500.

In order to achieve this objective, said power control unit 100 comprising at least a control circuit 110, and at least a control unit 120.

Said at least control circuit 110 is configured to sense said output power of said at least one charge pump converter 500 through said first output terminal 250 and said second output terminal 350 and to transmit a sensed power value 151, which may comprise a voltage sensed power value and/or current sensed power value, as a function of the sensed output power. According to an embodiment, said voltage sensed power value and/or said current sensed power value may be transmitted as analog signal to said at least a control unit 120, which is quicker than digital signal.

Said at least a control unit 120 may be configured to receive said sensed power value, to establish a control value and to send said control value to said primary attenuator controlling terminal 435 and said secondary attenuator controlling terminal 445 such as to modify said K factor. Thus, said power control unit 100 may sense the received power and may take actions to minimize the tag sensitivity and thus may maximize the tag reading distance.

As depicted in FIGS. 1A and 1B, said control circuit 110 may be configured to control a output current from said charge pump converter 500 and to measure a output voltage between said first output terminal 250 and said second output terminal 350 at lower input power levels across said first input terminal 210 and said second input terminal 310, and/or to control said output voltage and measure said output current at higher input power levels. Therefore, said control circuit 110 may comprise at least one control circuit configured to determine at least a first physical quantity between said first terminal 250 and said second terminal 350 and to measure at least a second physical quantity.

In other words, the charge pump converter output power is sensed with said at least a control circuit 110, which comprises at least a first power input terminal 112 and second power input terminal 111 configured to sense said output current and/or said output voltage value of said charge pump converter 500 and at least an internal reference 115 configured to set a reference value. During the adaptation of the impedance and/or of the K factor, said at least an internal reference 115 may be set such that said output current and/or said output voltage value of said charge pump converter 500 is slightly above the power-on-reset or POR value.

On top of that, at least a comparison circuit 117, comprised in said at least control circuit 110, is configured to compare said reference value to said output current value and/or said output voltage value sensed by said first power input terminal 112 and second power input terminal 111.

More specifically, said at least control circuit 110 is configured to conduct a current value by diverting said output current from said first output terminal 250 to said second output terminal 350 such as to evaluate said sensed power value.

Said output current is diverted by at least a current limited buffer 119 of said at least a control circuit 110. Said at least a current limited buffer 119 is configured to divert the current from said first output terminal 250 to said second output terminal 350 such as to evaluate the sensed power value. Indeed, said at least a current limited buffer 119 may be a shunt regulator used as control circuit, and said diverted current from said first output terminal 250 to said second output terminal 350 or current shunt may be proportional to said sensed power value.

The analog output of said at least control circuit 110 carries the information of the charge pump converter 500 output power, which is converted to a digital word by said at least control unit 120, and more specifically by at least a converter 122. The latter, i.e. said at least a converter 122, is configured to convert said sensed current value and/or said sensed voltage value of said charge pump converter 500 into a digital voltage value 124 and/or a digital current value 124, in other word, a copy of said diverted current 121 is converted to a digital word 124 by said at least a converter 122.

Said at least control unit 120, previously mentioned, comprises at least a controller 123 configured to establish an established voltage value and/or an established current value as a function of said sensed current value and/or said sensed voltage value of said charge pump converter 500, such as to find the best trim code to maximize Pout_d.

Thus, thanks to this arrangement, said power control unit 100 may reduce the spread of at least Input Resistance, Mismatch Loss, Quality Factor, Rectifier Efficiency and/or Match parameter over temperature and process variations.

In addition to the above advantage, if said charge pump converter 500, which may be a rectifier, is designed such that the tag input resistance matches the antenna resistance at the minimum input power at which the tag can operate, the Tag Sensitivity may be minimized and/or the Tag reading distance may be maximized over temperature and process variations.

FIGS. 4A-4G represent Tag input parallel resistance $R_{tp}$, input equivalent series resistance $R_{ts}$, Tag mismatch loss ML and Tag Quality Factor Q respectively, for a given input power as a function of temperature and over three process corners for a tag using an 8-stages differential Dickson charge pump converter with rectifier and with said power control unit 100. In the not trimmed case the trim code to the rectifier is kept fixed. In the trimmed case the trim code to the rectifier is determined by said power control unit 100 control loop.

Figure 5:
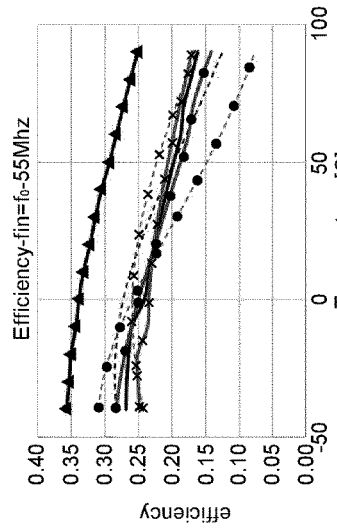
FIG. 5 represents a AutoMatch tag performances at $f_{in}=f_0-55$ MHz.
Figure 5:
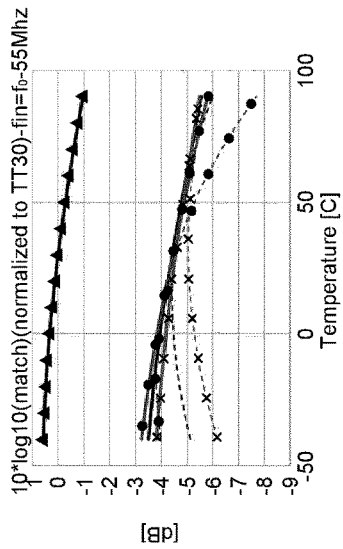
Figure 5:
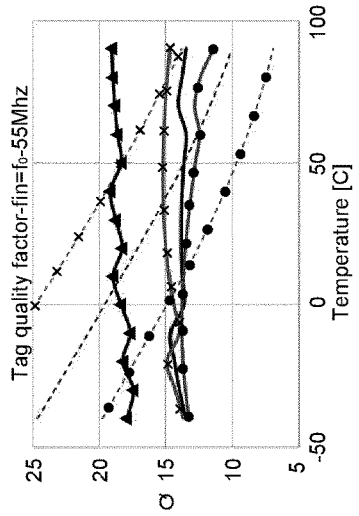
Figure 5:
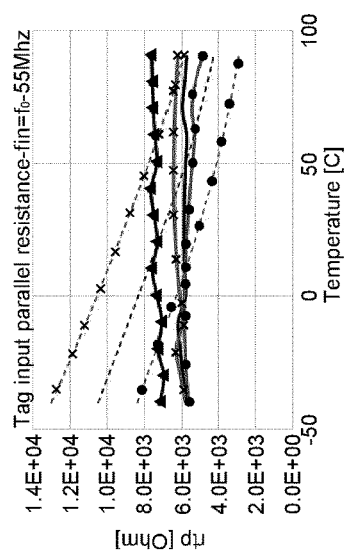
Figure 5:
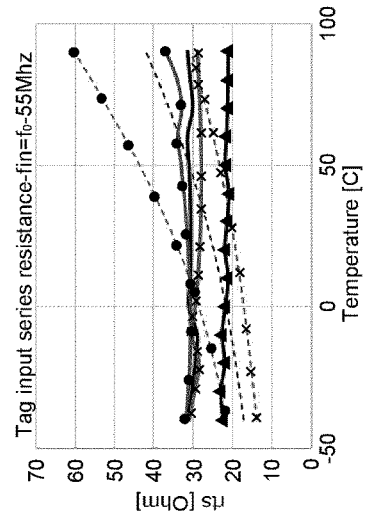

The AutoMatch tag performances are here evaluated for a given input power at $f_{in}=f_0-55$ MHz, see FIG. 5, with a series resonant RLC antenna-tag equivalent circuit tuned at $f_0$ and with an antenna quality factor equals to 16. In all the plots the performances out of resonance are compared with the TT-trimmed case at $f_{in}=f_0$. The «match» parameter is maximized in all the conditions even with an input frequency out of resonance $X_a \neq X_{ts}$.

In FIG. 6, the AutoMatch tag performances are evaluated for a given input power at $f_{in}=f_0+45$ MHz with a series resonant RLC antenna-tag equivalent circuit tuned at $f_0$ and with an antenna quality factor equals to 16. In all the plots the performances out of resonance are compared with the Π-trimmed case at $f_{in}=f_0$. The «match» parameter is maximized in all the conditions even with an input frequency out of resonance $X_a \neq X_{ts}$.

The invention claimed is:

1. A power control unit configured to control an efficiency of a charge pump converter having a first input terminal and a second input terminal, a primary attenuator and a secondary attenuator between said first input terminal and said second input terminal, a first output terminal, a second output terminal, a secondary attenuator controlling terminal and a primary attenuator controlling terminal configured to be plugged to said power control unit, said primary attenuator controlling terminal and said secondary attenuator controlling terminal being configured to attenuate or amplify a signal of said first input terminal and said second input terminal, said power control unit comprising:
   a first control circuit configured to sense an output power of said charge pump converter through said first output terminal and said second output terminal and transmit a sensed power value as a function of the sensed output power; and
   a second control circuit configured to receive said sensed power value, establish a control value, and send said control value to said secondary attenuator controlling terminal and said primary attenuator controlling terminal so as to attenuate or amplify a signal of at least one input signal,
   wherein the first control circuit is further configured to control an output current from the charge pump converter and measure an output voltage between the first output terminal and the second output terminal at lower input power levels across the first input terminal and the second input terminal, and/or control the output voltage and measure the output current at higher input power levels, and
   wherein the first control circuit further comprises a first power input terminal configured to sense the output current and/or the output voltage value of the charge pump converter, and a second power input terminal, a resistive divider connected between the first power input terminal and the second input terminal to be compared in a comparison circuit to an internal reference configured to set a reference value, and a current limited buffer at an output of the first control circuit linked to the second control circuit.

2. The power control unit according to claim 1, wherein said first control circuit is further configured to conduct a current value by diverting said output current from said first output terminal to said second output terminal such as to evaluate the sensed power value.

3. The power control unit according to claim 1, wherein said first control circuit further comprises:
   a first power input terminal and a second power input terminal, said first power input terminal and said second power input terminal being configured to sense said output current and/or said output voltage value of said charge pump converter;
   an internal reference configured to set a reference value;
   a comparison circuit configured to compare said reference value to said output current value and/or said output voltage value; and
   a current limited buffer configured to divert the current from said first output terminal to said second output terminal so as to evaluate the sensed power value.

4. The power control unit according to claim 1, wherein said second control circuit further comprises a controller configured to establish an established voltage value and/or an established current value as a function of said sensed current value and/or said sensed voltage value of said charge pump converter.

5. The power control unit according to claim 1, further comprising a bias supplier comprising a converter configured to convert said sensed current value and/or said sensed voltage value of said charge pump converter into a digital voltage value and/or a digital current value.

6. A control system device comprising the charge pump converter and the power control unit according to claim 1, said charge pump converter having a first input terminal and a second input terminal, the primary attenuator and the secondary attenuator between said first input terminal and said second input terminal, a first output terminal, a second output terminal, the secondary attenuator controlling terminal and the primary attenuator controlling terminal configured to be plugged to said power control unit.

7. The control system device according to claim 6, wherein said charge pump converter comprises a primary gate controller and a secondary gate controller,
   said primary gate controller comprises
      the primary attenuator;

the first output terminal configured to be connected to the first input terminal of the charge pump converter and/or a first circuit;

a first primary signal input configured to receive a first control signal;

a primary bias input configured to establish a voltage value and/or a current value of said primary gate controller; and the first input terminal configured to be connected to a primary signal output from a following charge pump converter and/or to receive a main signal from an integrated circuit; and said secondary gate controller comprises:

the secondary attenuator;

the second output terminal configured to be connected to the second input terminal of the charge pump converter and/or a second circuit;

a first secondary signal input configured to receive a second control signal;

a secondary bias input configured to establish a voltage value and/or a current value of said secondary gate controller; and the second input terminal configured to be connected to a secondary signal output from the following charge pump converter and/or to receive the main signal from the integrated circuit, said first primary signal input being configured to be connected to said second output terminal and said first secondary signal input being configured to be connected to said first output terminal.

8. The control system device according to claim 6, wherein said primary attenuator comprises a first primary capacitor connected between said primary attenuator input and said primary attenuator output, and a second primary capacitor connected between said primary attenuator output and said ground, and/or said secondary attenuator comprises a first secondary capacitor connected between said secondary attenuator input and said secondary attenuator output, and a second secondary capacitor connected between said secondary attenuator output and said ground.

9. The control system device according to claim 8, wherein said primary attenuator controlling terminal is configured to control a capacitance of said second primary capacitor and/or a capacitance of said second secondary capacitor.

10. The control system device according to claim 8, wherein said secondary attenuator controlling terminal is configured to control a capacitance of said first primary capacitor and/or a capacitance of said first secondary capacitor.

11. The control system device according to claim 6, wherein said primary gate controller comprises a primary switching element having a primary conduction path with a first primary terminal and a second primary terminal, and a primary gate configured to control a current flowing through said primary conduction path, said primary conduction path being configured to provide said primary signal, wherein said primary gate is configured to be connected to said first primary signal input and to said primary bias input, and/or wherein said secondary gate controller comprises a secondary switching element having a secondary conduction path with a first secondary terminal and a second secondary terminal, and a secondary gate configured to control a current flowing through said secondary conduction path, said secondary conduction path being configured to provide said secondary signal; and said secondary gate is configured to be connected to said first secondary signal input and to said secondary bias input.

12. The power control unit of claim 1, wherein the sensed power value comprises at least one of a voltage sensed power value and a current sensed power value.

13. The power control unit of claim 1, wherein the first control circuit is further configured to conduct a current value by diverting the output current from the first output terminal to the second output terminal so as to evaluate the sensed power value.

* * * * *

UNITED STATES PATENT AND TRADEMARK OFFICE
CERTIFICATE OF CORRECTION

| | | |
|---|---|---|
| PATENT NO. | : 11,876,444 B2 | |
| APPLICATION NO. | : 17/774473 | |
| DATED | : January 16, 2024 | |
| INVENTOR(S) | : Alessandro Venca | |

It is certified that error appears in the above-identified patent and that said Letters Patent is hereby corrected as shown below:

On the Title Page

Item (30) should read:
-- Foreign Application Priority Data
Nov. 5, 2019 (EP) ............................. 192072395
Jan. 29, 2020 (EP) ............................ 201544053
Nov. 5, 2020 (WO) ............ PCT/EP2020/081172 --

Signed and Sealed this
Eighth Day of October, 2024

Katherine Kelly Vidal
*Director of the United States Patent and Trademark Office*